US011177555B2

(12) United States Patent
Jang et al.

(10) Patent No.: US 11,177,555 B2
(45) Date of Patent: Nov. 16, 2021

(54) BACK COVER FOR PORTABLE TERMINAL AND BACK COVER-INTEGRATED ANTENNA MODULE INCLUDING THE SAME

(71) Applicant: AMOSENSE CO., LTD, Chungcheongnam-do (KR)

(72) Inventors: Kil Jae Jang, Seongnam-si (KR); Dong Hoon Lee, Yongin-si (KR); Ki Chul Kim, Incheon (KR); Jong Ho Park, Seoul (KR)

(73) Assignee: AMOSENSE CO. LTD., Chungcheongnam-do (KR)

( * ) Notice: Subject to any disclaimer, the term of this patent is extended or adjusted under 35 U.S.C. 154(b) by 664 days.

(21) Appl. No.: 15/999,108

(22) PCT Filed: Feb. 17, 2017

(86) PCT No.: PCT/KR2017/001785
§ 371 (c)(1),
(2) Date: Aug. 17, 2018

(87) PCT Pub. No.: WO2017/142350
PCT Pub. Date: Aug. 24, 2017

(65) Prior Publication Data
US 2021/0210836 A1 Jul. 8, 2021

(30) Foreign Application Priority Data

Feb. 17, 2016 (KR) .......................... 10-2016-0018699

(51) Int. Cl.
*H01Q 1/24* (2006.01)
*H01Q 7/00* (2006.01)
(Continued)

(52) U.S. Cl.
CPC ............... *H01Q 1/24* (2013.01); *H01Q 1/243* (2013.01); *H01Q 1/38* (2013.01); *H01Q 1/526* (2013.01);
(Continued)

(58) Field of Classification Search
CPC .......... H01Q 1/24; H01Q 7/00; H01Q 17/001; H01Q 17/00; H01Q 1/526; H01Q 1/243; H01Q 1/38; H05K 7/20
(Continued)

(56) References Cited

U.S. PATENT DOCUMENTS

| 8,489,162 B1 * | 7/2013 | Dou ..................... H01Q 13/106 |
| | | 455/575.7 |
| 9,756,155 B2 * | 9/2017 | Ettel .................... H04B 5/0081 |

(Continued)

FOREIGN PATENT DOCUMENTS

| JP | 2013-042376 A | 2/2013 |
| JP | 2015-149833 A | 8/2015 |

(Continued)

OTHER PUBLICATIONS

Chinese Office Action dated Jan. 3, 2020, issued in Chinese Application No. 201780011264.9, total 23 pages with English translation.
(Continued)

*Primary Examiner* — Hai V Tran
(74) *Attorney, Agent, or Firm* — Masuvalley & Partners

(57) ABSTRACT

Provided are a back cover for a portable terminal and a back cover-integrated antenna module including the same. A back cover for a portable terminal according to an embodiment of the present invention is disposed on the back surface of a portable terminal body, and includes a pattern portion, which is formed to pass through the back cover formed of a metal material at a region corresponding to at least one antenna and configured to reduce generation of an eddy current.

16 Claims, 9 Drawing Sheets

(51) Int. Cl.
*H01Q 17/00* (2006.01)
*H01Q 1/52* (2006.01)
*H01Q 1/38* (2006.01)
*H05K 7/20* (2006.01)

(52) U.S. Cl.
CPC ............... *H01Q 7/00* (2013.01); *H01Q 17/00* (2013.01); *H01Q 17/001* (2013.01); *H05K 7/20* (2013.01)

(58) Field of Classification Search
USPC .......................................................... 343/702
See application file for complete search history.

(56) References Cited

U.S. PATENT DOCUMENTS

| | | | | |
|---|---|---|---|---|
| 2004/0130788 A1* | 7/2004 | Minami | ................ | G06F 1/1609 359/601 |
| 2011/0227799 A1* | 9/2011 | Hashimoto | .......... | H01Q 1/2225 343/702 |
| 2015/0123604 A1* | 5/2015 | Lee | ........................ | H02J 50/12 320/108 |
| 2015/0236401 A1* | 8/2015 | Yamaguchi | .......... | H04B 5/0081 343/702 |
| 2015/0296567 A1* | 10/2015 | Tuengler | .................. | H05B 3/36 219/543 |
| 2015/0364824 A1* | 12/2015 | Song | ...................... | D02G 3/441 343/700 MS |
| 2016/0014244 A1 | 1/2016 | Yang et al. | | |
| 2016/0064814 A1* | 3/2016 | Jang | ........................ | H01Q 7/04 343/842 |
| 2016/0165018 A1 | 6/2016 | Ettel et al. | | |
| 2016/0323428 A1* | 11/2016 | Kim | .................. | H04M 1/72412 |
| 2018/0062417 A1* | 3/2018 | Choi | ..................... | H02J 7/0044 |
| 2018/0198310 A1* | 7/2018 | Hwang | .................. | H01F 27/22 |
| 2019/0044391 A1* | 2/2019 | Jang | ..................... | H04B 5/0081 |

FOREIGN PATENT DOCUMENTS

| | | |
|---|---|---|
| KR | 10-2004-0070312 A | 8/2004 |
| KR | 10-2011-0090698 A | 8/2011 |
| WO | 2014/008057 A1 | 1/2014 |
| WO | 2015-010147 A1 | 1/2015 |

OTHER PUBLICATIONS

ISA/KR, International Search Report dated Jun. 20, 2017, issued in International Application No. PCT/KR2017/001785, total 4 pages with English translation.

* cited by examiner

BACK COVER FOR PORTABLE TERMINAL AND BACK COVER-INTEGRATED ANTENNA MODULE INCLUDING THE SAME

CROSS REFERENCE TO RELATED APPLICATIONS

This application is the national phase entry of International Application No. PCT/KR2017/001785, filed on Feb. 17, 2017, which is based upon and claims priority to Korean Patent Applications 10-2016-0018699, filed on Feb. 17, 2016. The entire contents of which are incorporated herein by reference.

TECHNICAL FIELD

The present invention relates to a back cover for a portable terminal and a back cover-integrated antenna module including the same, and more specifically, to a back cover for a portable terminal in which an antenna smoothly operate by reducing eddy current when the back cover is formed of a metal material, and a back cover-integrated antenna module including the same.

BACKGROUND

Recently, various functions such as radio frequency identification (RFID: wireless identification), near field wireless communication (NFC), wireless power transfer (WPT), an interactive pen tablet, and the like have been added to portable terminals such as a mobile phone, a tablet PC, etc.

A wireless power transmission function for wirelessly charging a built-in battery is provided in the portable terminal, and a charging method via the wireless power transmission is performed by a wireless power reception module embedded in the portable terminal, and a wireless power transmission module configured to supply power to the wireless power reception module.

That is, by transmitting the power using a magnetic field generated by a transmission coil and a reception coil, the battery for the portable terminal is charged.

Meanwhile, a recent portable terminal has been using metal for a material of a case including a back cover for aesthetics and durability. The metal case has a greater rigidity than plastic due to a characteristic of the metal material, and thus can improve the durability.

However, in a case of the metal, since the metal has conductivity due to a characteristic thereof and thus an eddy current is induced by a magnetic field generated from an antenna, the antenna cannot perform a function thereof.

Particularly, when a charging method via the wireless power transmission is applied to the portable terminal, applying the metal material for the back cover of the portable terminal has limitations due to the eddy current.

SUMMARY OF THE INVENTION

The present invention is directed to providing a back cover for a portable terminal in which generation of an eddy current is reduced by a pattern portion and thus an antenna performs a function thereof even when the back cover for a portable electronic device is formed of a metal material, and a back cover-integrated antenna module including the same.

Further, the present invention is directed to providing a back cover for a portable terminal configured to allow an antenna module to be disposed on one surface thereof without increasing an overall thickness thereof, to implement thinning, and a back cover-integrated antenna module including the same.

The present invention provides a back cover for a portable terminal formed of a metal material and disposed on a back surface of a portable terminal main body including a pattern portion configured to reduce generation of an eddy current and formed to pass through a region corresponding to at least one antenna, which is disposed in one surface of the back cover and operates at a predetermined frequency band.

The pattern portion may include at least one of a linear shape having a predetermined length and a through hole having a predetermined area.

Patterns close to each other may be formed to be disconnected from each other.

Each of the patterns may include a protection material filled therein.

The protection material may be formed of a nonconductive and nonmagnetic material.

As another example, the pattern portion may include a through port formed to pass through a predetermined area including the area corresponding to the antenna, a mesh body formed of a metal material and disposed in the through port, and a protection layer filled in the through port and configured to connect the mesh body and the back cover. A plurality of weft threads and a plurality of warp threads disposed to form a plurality of through holes may be electrically insulated from each other in the mesh body.

An accommodation groove may be formed in an inner surface of the back cover to be recessed to accommodate an overall thickness or some of a thickness of the antenna.

The pattern portion may be formed to pass through a bottom surface of the accommodation groove.

The back cover may be formed of a metal material including at least one of copper, aluminum, gold, and silver.

Meanwhile, the present invention provides a back cover for a portable terminal disposed on a back surface of a portable terminal main body, wherein the back cover including a mesh body in which a plurality of weft threads and a plurality of warp threads each formed of a metal material are arranged to form a plurality of through holes, and a protection layer that covers the mesh body or is filled in the through hole.

The plurality of weft threads and the plurality of warp threads may be electrically insulated from each other.

The protection layer may be formed of a nonconductive and nonmagnetic material.

Meanwhile, the present invention provides a back cover-integrated antenna module including the above-described back cover for a portable terminal, at least one antenna disposed in the back cover and operating at a predetermined frequency band, and a magnetic field shielding sheet disposed on one surface of the antenna to shield a magnetic field generated from the antenna so that the magnetic field is focused in a predetermined direction.

The antenna may be attached to an inner surface of the back cover through an adhesive member having nonconductivity.

The antenna may be any one of a WPT antenna, an MST antenna, and an NFC antenna or be a combo type including at least two antennas of a WPT antenna, an MST antenna, and an NFC antenna.

A heat-radiation sheet for heat radiation may be stacked on one surface of the magnetic field shielding sheet.

According to the present invention, even when a back cover of a portable terminal is formed of a metal material, an antenna can perform a function by reducing generation of an eddy current through a pattern portion so that a wireless charging method can be applied.

Further, the present invention can implement thinning by allowing an antenna module to be disposed on one surface of the back cover without increasing a whole thickness thereof.

DETAILED DESCRIPTION OF THE INVENTION

Figure 1:
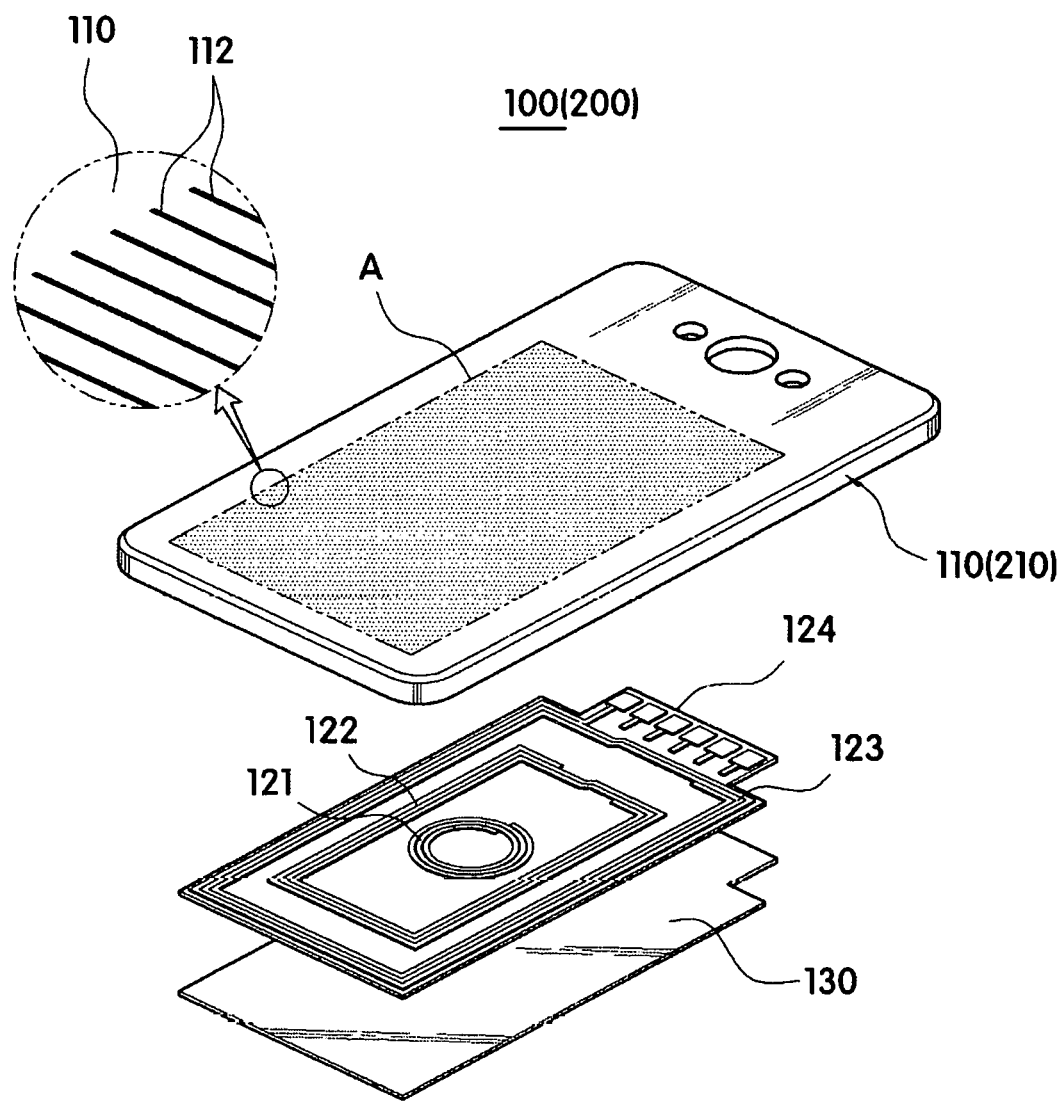
FIG. 1 is a schematic view illustrating an antenna module including a back cover for a portable terminal according to the present invention.
Figure 2:
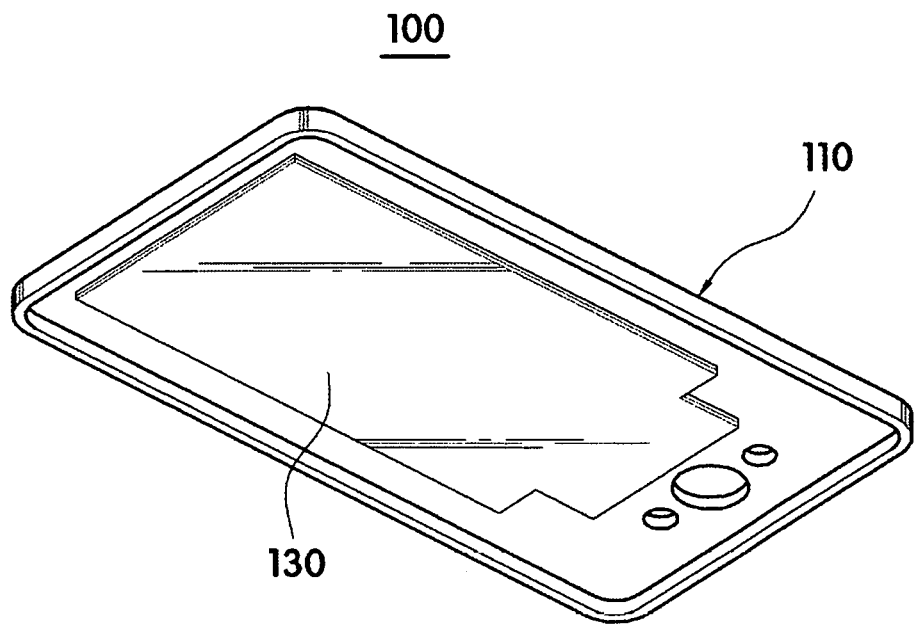
FIG. 2 is a bottom view illustrating a back cover-integrated antenna module according to a first embodiment of the present invention.

Hereinafter, exemplary embodiments of the present invention will be described in detail with reference to the accompanying drawings which may allow one of ordinary skill in the art to easily perform the present invention. The present invention may be implemented in various forms and is not limited to the following embodiments. Components not related to the description are omitted in the drawings to clearly describe the present invention, and the same reference symbols are used for the same or similar components in the description.

Back covers for portable terminals 110, 210, 310, and 410 according to the present invention may be disposed on a back surface of a portable terminal main body 10 to protect a battery 20 embedded in the main body 10 of a portable terminal 1, and the like, from an external environment.

Figure 11:
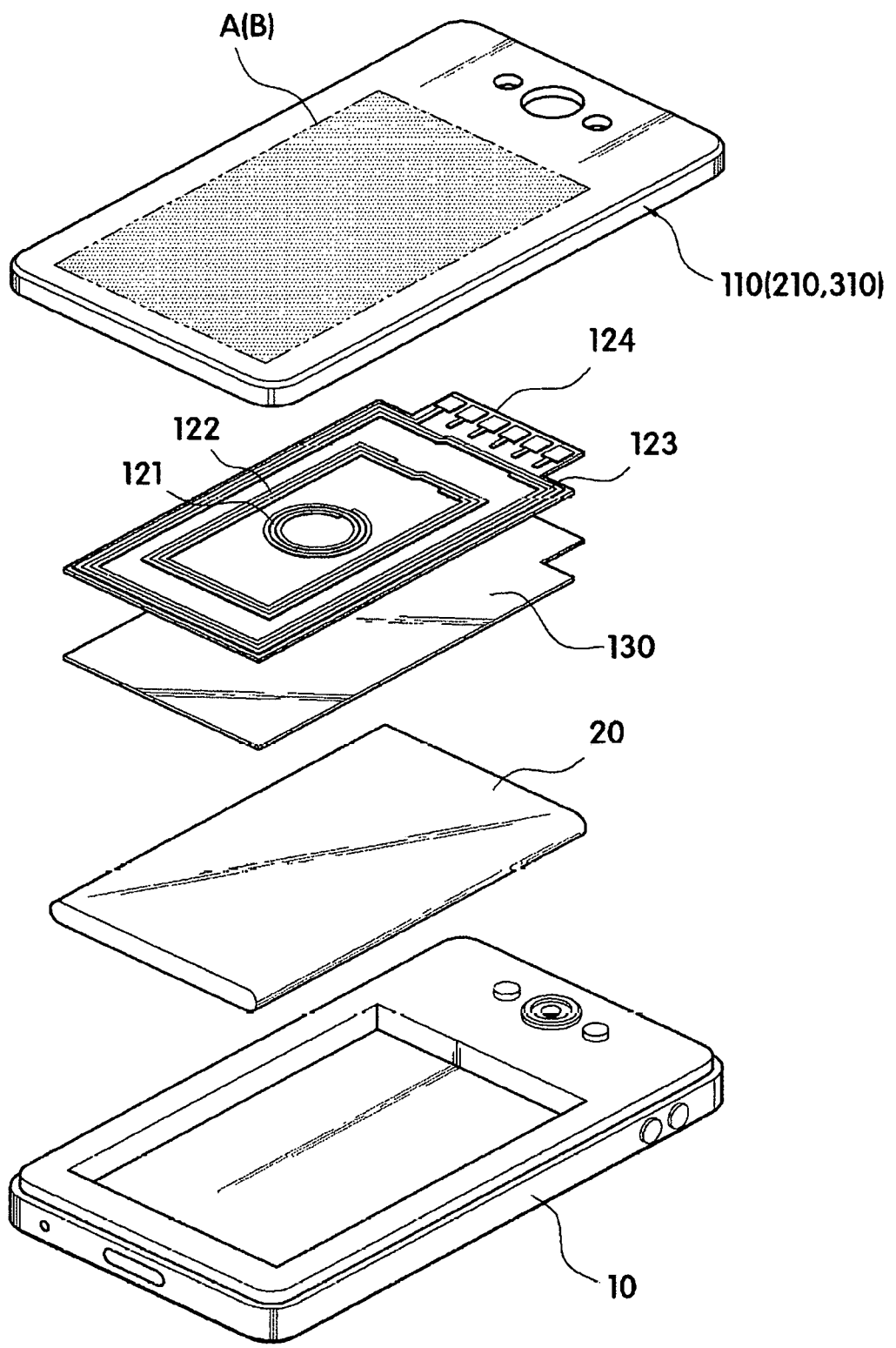
FIG. 11 is a view illustrating a state in which the back cover for a portable terminal according to the present invention is applied as a back cover of the portable terminal.

That is, as shown in FIG. 11, the back covers for the portable terminals 110, 210, 310, and 410 according to the present invention may cover the back surface of the portable terminal main body 10 to protect various components embedded in the portable terminal main body 10, for example an AP, a battery, etc.

The above-described back covers 110, 210, 310, and 410 may be formed of a metal material such as aluminum, copper, gold, silver, or the like, may be provided to cover only the back surface of the portable terminal main body 10, and may be provided to cover all of the back surface and side surfaces of the portable terminal main body 10. Further, the back covers 110, 210, 310, and 410 may be detachably coupled to the portable terminal main body 10, and may also be integrally provided.

In the present invention, the portable terminal 1 may be an electronic device which is portable and easy to be carried. For example, the portable terminal 1 may be a mobile phone such as a smart phone or the like, and may also be a smart watch, a digital camera, a DMB, an electronic book, a net book, a tablet PC, a personal computer, or the like.

In this case, since a pattern portion A is formed in each of the back covers for the portable terminals 110 and 210 according to an embodiment of the present invention to reduce an eddy current, which is induced from a magnetic field generated during an operation of an antenna even when a body is formed of a metal material, the antenna may normally operate (see FIG. 1).

That is, the pattern portion A may be formed so that a predetermined pattern 112 passes through each of the back covers 110 and 210. Accordingly, the pattern portion A may increase an overall resistance of each of the back covers 110 and 210, and thus may reduce the eddy current induced by the magnetic field generated during the operation of the antenna.

Here, the antenna may be single type including any one of a WPT antenna 121, an MST antenna 122, and an NFC antenna 123 or may be a combo type including at least two antennas of a WPT antenna 121, an MST antenna 122, and an NFC antenna 123 (see FIG. 1).

To this end, the pattern portion A may be formed in a region corresponding to the antennas 121, 122, and 123 disposed in each of the back covers 110 and 210.

Figure 7:
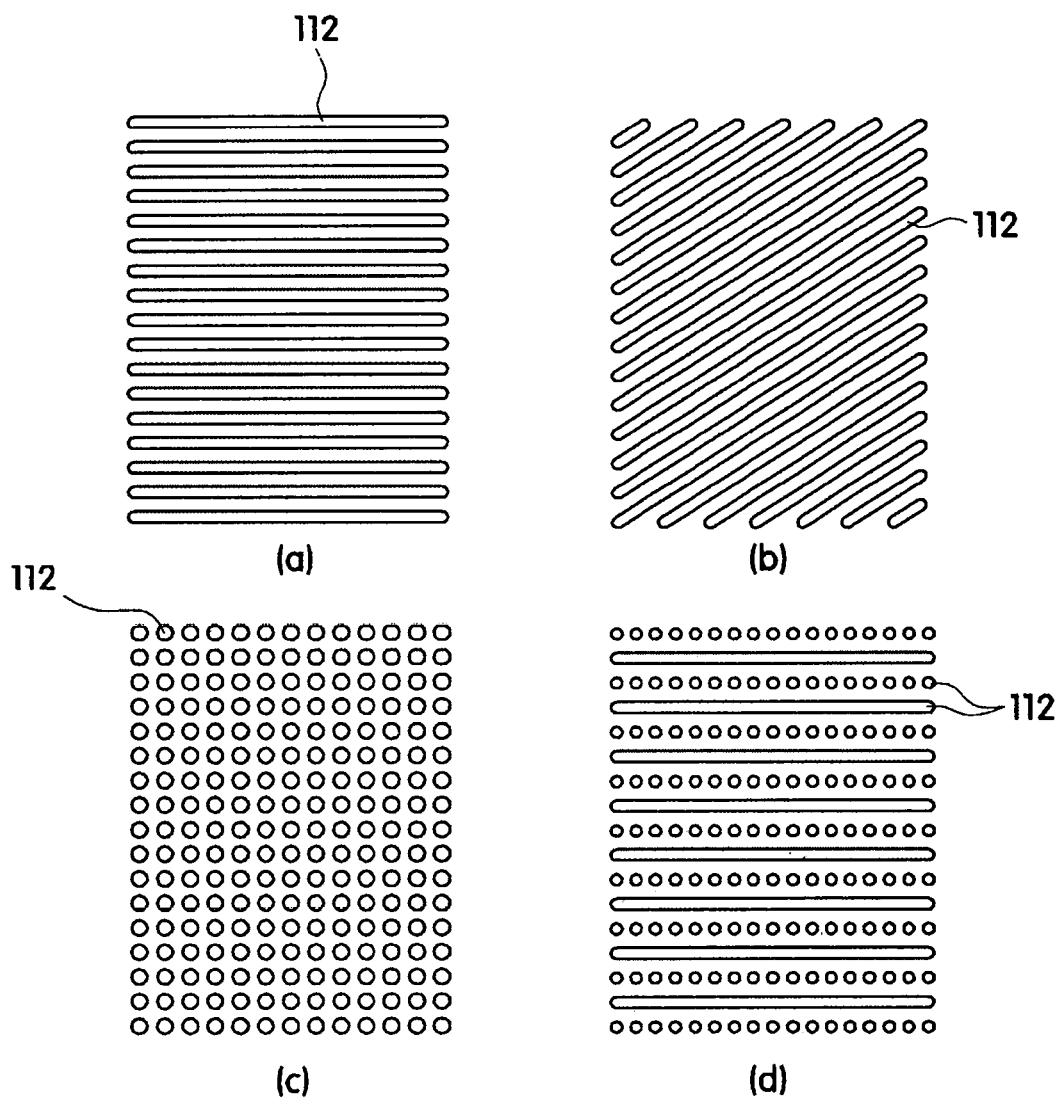
FIG. 7 is a view illustrating various shapes of a pattern applied to the back cover for a portable terminal according to the present invention and the back cover-integrated antenna module including the same.

In this case, the pattern 112 may be provided in a form of slits having a predetermined length, in a form of through holes having a predetermined area, and also in a form in which the slits and the through holes are combined (see FIG. 7). However, it should be disclosed that all of shapes in which patterns close to each other are disconnected from each other are available.

For example, the pattern 112 may be formed to have a line width or a diameter of 30 um~5 mm, and preferably, may be formed to have a minute line width or a minute diameter of 30 um~150 um.

As described above, since the pattern 112 is formed to pass through each of the back covers for the portable terminals 110 and 210 according to the embodiment of the present invention, a discontinuous region may be formed in at least some regions, and since the overall resistance of each of the back covers 110 and 210 is increased through the discontinuous region, generation of the eddy current may be reduced. Accordingly, since the antennas 121, 122, and 123 normally operate and transmission efficiency of the antennas are improved at the same time, charging efficiency of such as wireless charge or the like may be improved.

Figure 3:
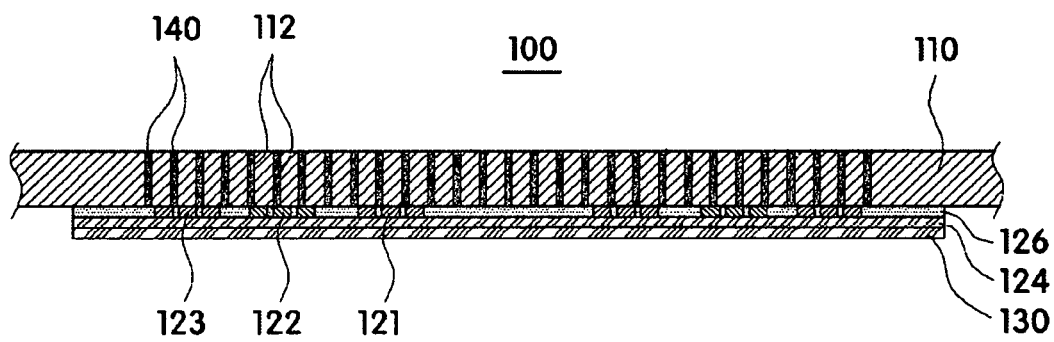
FIG. 3 is a partial cross-sectional view of FIG. 2.
Figure 4:
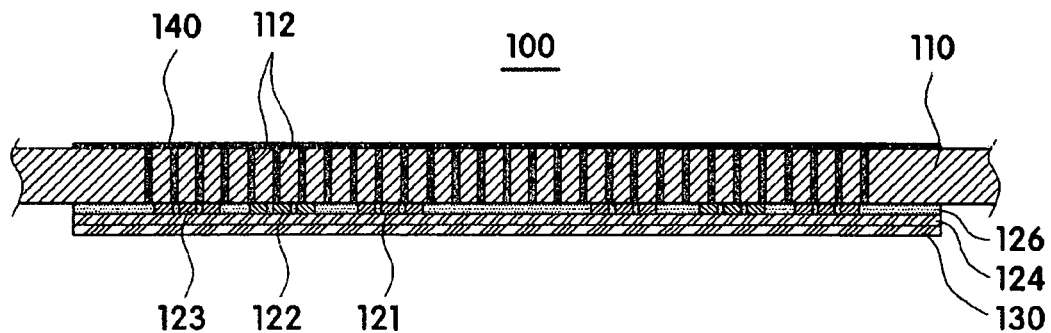
FIG. 4 is a partial cross-sectional view illustrating another shape of a protection material in FIG. 3.
Figure 6:
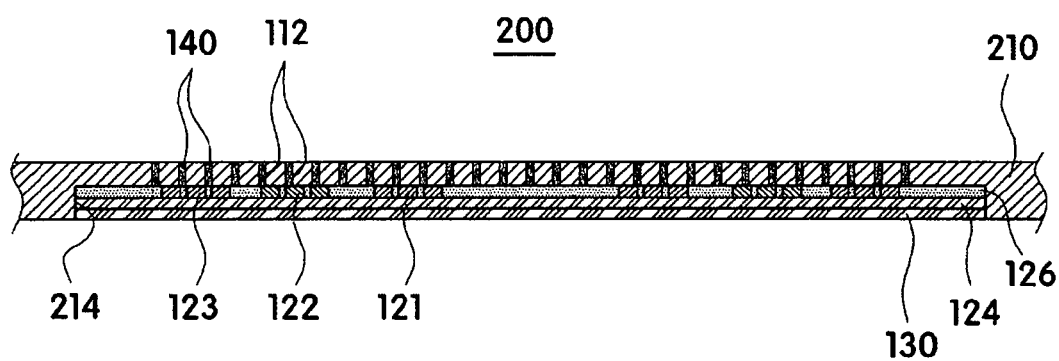
FIG. 6 is a partial cross-sectional view of FIG. 5.

Meanwhile, a protection material 140 may be filled in at least one pattern 112 formed to pass through each of the back covers 110 and 210 (see FIGS. 3, 4, and 6). The protection material 140 may be formed of a nonconductive and non-magnetic material to improve airtightness by preventing permeation of moisture or foreign substances through the pattern 112 without having an impact on the performance of each of the antennas 121, 122, and 123. For example, the protection material 140 may be an insulating fluorinate resin such as PI, PET, PP, PTFE, etc.

The above-described protection material 140 may be provided to be filled in only the pattern 112 (see FIGS. 3 and 6), may be formed on one surface of each of the back covers 110 and 210 to be filled in the pattern 112 (see FIG. 4), and may be configured so that an injection-molded object formed of a nonconductive and nonmagnetic material through insert injection-molding covers a region including the pattern portion A.

Figure 5:
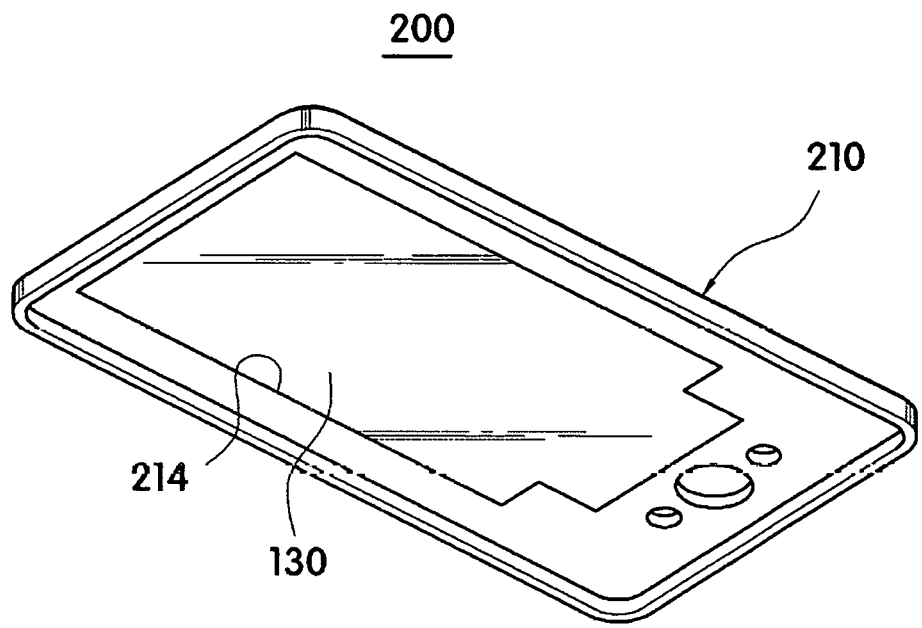
FIG. 5 is a bottom view illustrating a back cover-integrated antenna module according to a second embodiment of the present invention.

Meanwhile, an accommodation groove 214 configured to accommodate some or all of a thickness of each of the antennas 121, 122, and 123 may be formed in the back cover for the portable terminal 210 according to the present invention (see FIGS. 5 and 6).

That is, a region in an overall area of the back cover 210 on which each of the antennas 121, 122, and 123 is disposed may be formed to have a relatively smaller thickness than the remaining region, and thus the accommodation groove 214 formed to be recessed from one surface of the back cover 210 at a predetermined depth may be formed.

Accordingly, since some or all of the thickness of each of the antennas 121, 122, and 123 are accommodated by the accommodation groove 214, the portable terminal main body may not require a separate space for disposing each of the antennas 121, 122, and 123 or may minimize the separate space. Accordingly, since an overall thickness of the portable terminal may be decreased as much as the thickness of each of the antennas 121, 122, and 123, the portable terminal may be implemented to be thinner.

Here, in a case in which the accommodation groove 214 is formed in one surface of the back cover 210, the at least one pattern 112 forming the pattern portion A may be formed to pass through a bottom surface of the accommodation groove 214.

Further, in a case in which a magnetic field shielding sheet 130 is disposed on one surface of each of the antennas 121, 122, and 123, the accommodation groove 214 may be formed to have a predetermined depth to accommodate some or all of a thickness in which the thickness of each of the antennas 121, 122, and 123 and a thickness of the magnetic field shielding sheet 130 are combined. In addition, in a case in which a heat-radiation sheet (not shown) is stacked on one surface of the magnetic field shielding sheet 130, the accommodation groove 214 may be formed to have a predetermined depth to accommodate some or all of a thickness in which the thickness of each of the antennas 121, 122, and 123, the thickness of the magnetic field shielding sheet 130, and a thickness of the heat-radiation sheet are combined.

Figure 8:
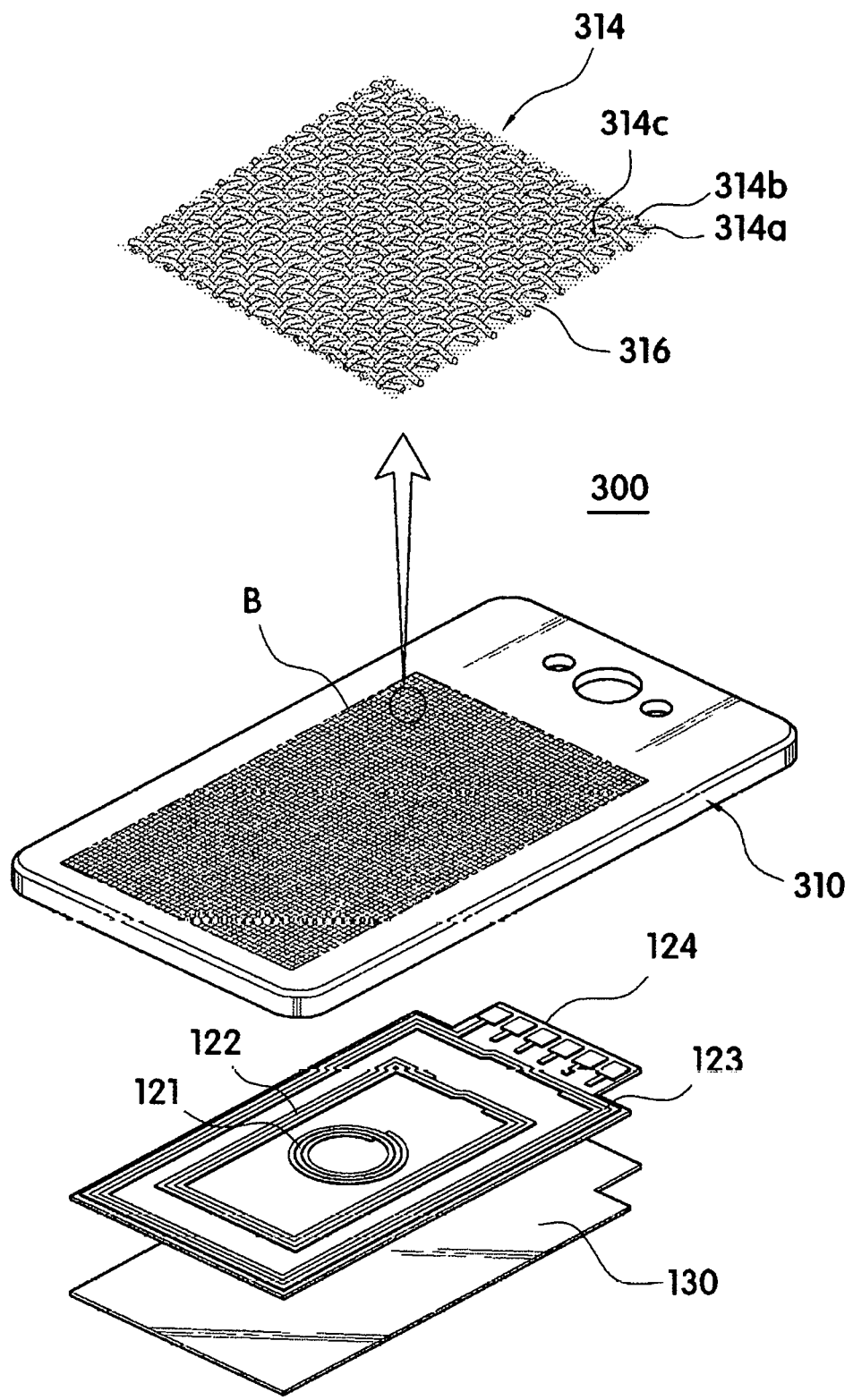
FIG. 8 is a schematic view illustrating an antenna module including a back cover for a portable terminal according to a third embodiment of the present invention.
Figure 9:
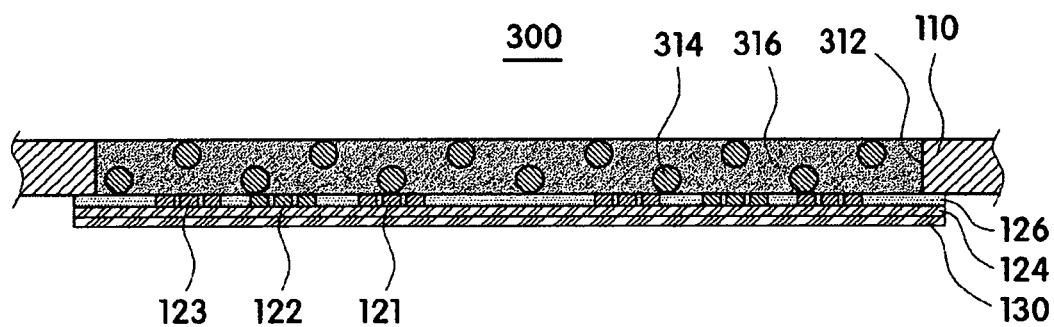
FIG. 9 is a partial cross-sectional view of FIG. 8.

Meanwhile, as shown in FIGS. 8 and 9, a mesh body 314 may be disposed in a region corresponding to the antennas 121, 122, and 123 in the back cover for the portable terminal 310 according to another embodiment of the present invention to reduce the generation of the eddy current.

That is, the back cover for the portable terminal 310 according to the embodiment may include a through port 312 formed to pass therethrough in a predetermined area, and may have a shape in which the mesh body 314 is disposed in the through port 312. In this case, the through port 312 may be formed to pass through the back cover 310 to include areas corresponding to the antennas 121, 122, and 123.

In the embodiment, the mesh body 314 may have a shape in which a plurality of weft threads 314a and a plurality of warp threads 314b, each formed of a metal material, are alternatively disposed to form a plurality of through holes 314c, the mesh body 314 may be formed of the same metal material as the metal material forming the back cover 310, and may be formed of a metal material different from the metal material forming the back cover 310.

The above-described mesh body 314 may be integrated with the back cover 310 through a protection layer 316 filled in the through port 312.

In this case, the plurality of weft threads 314a and the plurality of warp threads 314b may be electrically insulated from each other to reduce the generation of the eddy current.

To this end, the weft threads 314a and the warp threads 314b each having a predetermined length may be alternatively arranged in a state in which insulation layers are formed by coating materials, including enamel, epoxy resin, or the like in outer surfaces thereof, to be electrically insulated from each other.

Further, the plurality of weft threads 314a and the plurality of warp threads 314b may be formed to each have a line width or a diameter of 30 um~5 mm, and preferably, may be provided to each have a minute line width or a minute diameter of 30 um~150 um.

In addition, the protection layer 316 may be formed of a nonconductive and nonmagnetic material to improve air-tightness by preventing permeation of moisture or foreign substances through the through holes 314c without having an impact on the performance of each of the antennas 121, 122, and 123. For example, the protection layer 316 may be formed of an insulating fluorinate resin such as PI, PET, PP, PTFE, etc.

The above-described protection layer 316 may be formed to be filled in only a hollow space including the through holes 314c formed by the weft threads 314a and the warp threads 314b, and may be filled in the through port 312 to completely cover the mesh body 314.

Figure 10:
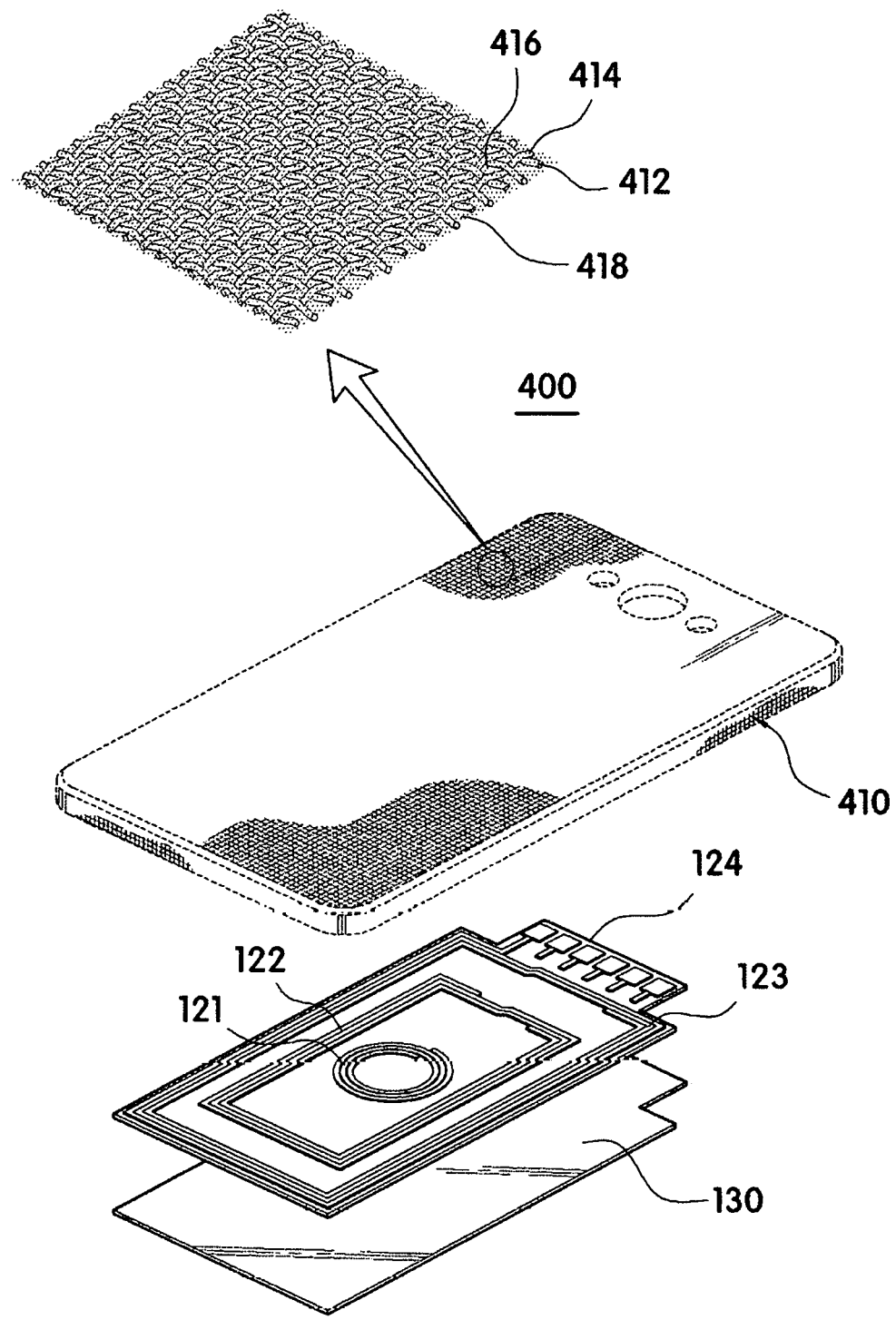
FIG. 10 is a schematic view illustrating an antenna module including a back cover for a portable terminal according to a fourth embodiment of the present invention.

Meanwhile, as shown in FIG. 10, the back cover 410 may be formed with a mesh body in the back cover for the portable terminal 410 according to still another embodiment of the present invention. In this case, the mesh body forming the back cover 410 may have a shape in which a plurality of weft threads 412 and a plurality of warp threads 414 each formed of a metal material are arranged to form a plurality of through holes 416.

Here, since the weft threads 412 and the warp threads 414 each having a predetermined length may be alternatively arranged in a state in which insulation layers are formed by coating materials, including enamel, epoxy resin, or the like in outer surfaces thereof, to be electrically insulated from each other, the generation of the eddy current may be reduced.

Further, the back cover 410 may include a protection layer 418 to prevent introduction of moisture or foreign substances into the portable terminal main body 10 through the through hole 416, and the protection layer 418 may be filled in the through hole 416 or completely cover the back cover 410.

In this case; the protection layer 418 may be formed of a nonconductive and nonmagnetic material to prevent having an impact on the performance of each of the antennas 121, 122, and 123. For example, the protection layer 418 may be formed of an insulating fluorinate resin such as PI, PET, PP, PTFE, etc.

As described above, since the back cover for the portable terminal 410 according to the embodiment of the present invention is formed with a mesh body in which a discontinuous region through the plurality of through holes 416 is formed, an overall resistance may be increased and thus the generation of the eddy current may be reduced. Accordingly, although the back cover for the portable terminal 410 according to the embodiment is formed of the metal material, since the antennas 121, 122, and 123 normally operate and the transmission efficiency of the antennas are improved at the same time, the wireless charge may be performed.

The above-described back covers for the portable terminals 110, 210, 310, and 410 according to the present invention may be applied to the portable terminal 1 including the antenna module.

Here, the antenna module may include at least one antenna 121, 122, and 123 each configured to perform a predetermined function at a predetermined frequency band, and the magnetic field shielding sheet 130 configured to shield the magnetic field generated from the antennas.

The antenna module may be embedded in the portable terminal main body 10 or attached to one side of the portable terminal main body 10, but may also be attached to the one surface of each of the back covers for the portable terminals 110, 210, 310, and 410.

The antenna module may be integrally formed with the back covers for the portable terminals 110, 210, 310, and 410 to protect the battery 20 embedded in the main body 10 of the portable terminal 1 from the external environment, and thus may be implemented as the back cover-integrated antenna modules 100, 200, 300, and 400.

Here, each of the back cover-integrated antenna modules 100, 200, 300, and 400 may include the WPT antenna 121 to receive wireless power, thereby serving as a wireless power reception module configured to charge the battery 20.

That is, in a case in which each of the back cover-integrated antenna modules 100, 200, 300, and 400 includes the WPT antenna 121, each of the back cover-integrated antenna modules 100, 200, 300, and 400 may wirelessly receive power from a wireless power transmission module when the separately provided wireless power transmission module (not shown) becomes close thereto. Accordingly, each of the back cover-integrated antenna modules 100, 200, 300, and 400 may charge the battery 20 by receiving the power supplied from the wireless power transmission module through the WPT antenna 121, and then supplying the power to the battery 20 embedded in the main body 10 of the portable terminal 1.

The back cover-integrated antenna modules 100, 200, 300, and 400 according to the present invention may include the back covers for the portable terminals 110, 210, 310, and 410, at least one antenna 121, 122, and 123, and the magnetic field shielding sheet 130.

Here, the back covers for the portable terminals 110, 210, 310, and 410 are provided to cover one surface of the portable terminal main body 10 and protect various components embedded in the main body 10, for example an AP, a battery, and the like, and may be formed of a metal material such as aluminum, copper, gold, silver, or the like. Also the back covers for the portable terminals 110, 210, 310, and 410 may be provided to cover only the back surface of the portable terminal main body 10, and may be provided to cover all of the back surface and the side surfaces of the portable terminal main body 10. Further, the back covers 110, 210, 310, and 410 may be detachably coupled to the portable terminal main body 10, and may be integrally provided.

In this case, as described above, each of the back covers for the portable terminals 110, 210, 310, and 410 may include pattern portions A and B in a region corresponding to the antennas 121, 122, and 123 to reduce generation of the eddy current by the magnetic field, and may be entirely formed with the mesh body.

Since the back covers for the portable terminals 110, 210, 310, and 410 are same as described above, detailed descriptions will be omitted.

The at least one antenna 121, 122, and 123 may be disposed in each of the back covers for the portable terminals 110, 210, 310, and 410, and operate at the predetermined frequency band to perform a predetermined function such as power transmission, etc.

Each of the antennas 121, 122, and 123 may include a circular, elliptical, or quadrangular plate-shaped coil which is wound in a clockwise direction or a counterclockwise direction, but may not be limited thereto, and may be formed by patterning a conductor such as a copper film, or the like on at least one surface of a circuit board 124 formed of a synthetic resin such as polyimide (PI), PET, or the like, and may be formed in a loop-shaped metal pattern using conductive ink.

Hereinafter, the antennas 121, 122, and 123 are described to be formed in the loop-shaped pattern on at least one surface of the circuit board 124 for convenience of the description.

In this case, the antenna 121, 122, and 123 may be single type including any one of a WPT antenna 121 for wireless power transmission, an MST antenna 122 for magnetic, security payment, and an NFC antenna 123 for wireless communication or may be a combo type including at least two antennas of the WPT antenna 121, the MST antenna 122, and the NFC antenna 123.

For example, both of the MST antenna 122 and the NFC antenna 123 may be disposed at the outside of the WPT antenna 121 in the antennas 121, 122, and 123 (see FIG. 1).

Here, the WPT antenna 121 may serve as a reception coil configured to receive a power signal supplied from the wireless power transmission module, may operate in an induction coupling method on the basis of an electromagnetic induction phenomenon using a frequency band from 100 kHz to 350 kHz, and may operate in a magnetic resonance method using a resonance frequency of 6.78 MHz frequency band.

Further, each of the back cover-integrated antenna modules 100, 200, 300, and 400 according to the present invention includes an attractor (not shown) disposed in a hollow space at a center of the plate-shaped coil 120 to induce some of magnetic force lines generated from a permanent magnet.

Here, the attractor may serve as to cause a change in the voltage value at the hall sensor by inducing some of the magnetic force lines generated from the permanent magnet, when the wireless power transmission module including the permanent magnet becomes close thereto, and may be formed of a magnetic material to induce some of the magnetic force lines generated from the permanent magnet.

In this case, the antennas 121, 122, and 123 may each have one surface attached to the inside of each of the back covers for the portable terminals 110, 210, 310, and 410 formed of a metal material, and may be electrically insulated from the back covers for the portable terminals 110, 210, 310, and 410. To this end, each of the antennas 121, 122, and 123 may have an insulation layer formed of a coating material including enamel, epoxy resin, or the like. For example, when each of the antennas 121, 122, and 123 is provided as a plate-shaped coil, the coating material may be coated on a surface of the coil, and when each of the antennas 121, 122, and 123 is formed in an antenna pattern on the circuit board, the coating material may be coated to cover both the circuit board and the antenna pattern, and may also be coated to cover only the antenna pattern.

The above-described antennas 121, 122, and 123 may be attached to one surface of each of the back covers for the portable terminals 110, 210, 310, and 410 through an adhesive member 126. In this case, a liquid type or gel type adhesive may be used as the adhesive member 126, and the adhesive member 126 may be a type in which an adhesive is formed on one surface or both surfaces of a base material. Here, the adhesive may include a nonconductive ingredient to block electric connection between the antennas 121, 122, and 123, and the back covers for the portable terminals 110, 210, 310, and 410.

The magnetic field shielding sheet 130 is formed of a magnetic material and serves as to focus the magnetic field generated from the antennas 121, 122, and 123 in a predetermined direction by shielding the magnetic field. The magnetic field shielding sheet 130 may be attached to the inside of each of the back covers for the portable terminals 110, 210, 310, and 410 to cover one surface of each of the antennas 121, 122, and 123.

The above-described magnetic field shielding sheet 130 may be formed of the various known materials. For example, a ribbon sheet including at least one of an amorphous alloy and a nanocrystalline alloy, a ferrite sheet, a polymer sheet, or the like may be used as the magnetic field shielding sheet 130.

Further, the magnetic field shielding sheet 130 may be flaked to form a plurality of pieces, and may be formed in multiple layers.

In addition, when the antennas 121, 122, and 123 is provided as a combo type in which the antennas 121, 122, and 123 perform different functions, a different type of shielding sheet may be used as the magnetic field shielding sheet 130 so as to improve performance of the antenna, the different type of shielding sheet may have a stacked shape or a frame shape in which one is accommodated in the other one.

Since the above-described magnetic field shielding sheet 130 has the known configuration, detailed description will be omitted, and all of the known shielding sheets used as the shielding sheet may be disclosed to be used.

Further, the heat-radiation sheet (not shown) for heat-radiation may be attached to one surface of the magnetic field shielding sheet 130 in each of the back cover-integrated antenna modules 100, 200, 300, and 400 according to the present invention. The heat-radiation sheet may be formed of a material having superior heat conductivity such as graphite.

Although one embodiment of the present invention is described above, the spirit of the present invention is not limited to the embodiment shown in the description, and although those skilled in the art may provide other embodiments due to addition, change, or removal of the components within the scope of the same spirit of the present invention, such embodiments and the above embodiments are also included in the scope of the spirit of the present invention.

The invention claimed is:

1. A back cover for a portable terminal formed of a metal material and disposed on a back surface of a portable terminal main body, comprising:
   a pattern portion which is formed to pass through the back cover formed of a metal material at a region corresponding to at least one antenna and configured to reduce generation of an eddy current;
   wherein the pattern portion includes:
   a through port formed to pass through the back cover at a predetermined area including the area corresponding to the at least one antenna;
   a mesh body formed of a metal material and disposed in the through port; and
   a protection layer filled in the through port and configured to connect the mesh body and the back cover.

2. The back cover of claim 1, wherein the pattern portion is at least one pattern including at least one of a linear pattern and a through hole pattern.

3. The back cover of claim 2, wherein the pattern portion includes the linear pattern and the through hole pattern, wherein the pattern portion close to each other are formed to be disconnected from each other.

4. The back cover of claim 2, wherein each of the patterns includes a protection material filled therein.

5. The back cover of claim 4, wherein the protection material is formed of a nonconductive and nonmagnetic material.

6. The back cover of claim 1, wherein the mesh body includes a plurality of weft threads and a plurality of warp threads arranged to form a plurality of through holes,
   wherein the plurality of weft threads and the plurality of warp threads are electrically insulated from each other.

7. The back cover of claim 1, wherein the back cover includes an accommodation groove recessed in an inner surface thereof,
   wherein the accommodation groove accommodates some or all of a thickness of the antenna.

8. The back cover of claim 7, wherein the pattern portion is formed to pass through a bottom surface of the accommodation groove at a region corresponding to the at least one antenna.

9. The back cover of claim 1, wherein the back cover is formed of a metal material including at least one of copper, aluminum, gold, and silver.

10. The back cover of claim 1,
    wherein the plurality of weft threads and a plurality of warp threads each formed of a metal material are arranged to form a plurality of through holes.

11. The back cover of claim 10, wherein the plurality of weft threads and the plurality of warp threads are electrically insulated from each other.

12. The back cover of claim 10, wherein the protection layer is formed of a nonconductive and nonmagnetic material.

13. A back cover-integrated antenna module comprising:
    a back cover for a portable terminal including a pattern portion;
    at least one antenna disposed in the back cover and operating at a predetermined frequency band; and
    a magnetic field shielding sheet disposed on one surface of the antenna to shield a magnetic field generated from the antenna so that the magnetic field is focused in a predetermined direction,
    wherein the pattern portion is formed to pass through the back cover at a region corresponding to at least one antenna and configured to reduce generation of an eddy current;
    wherein the pattern portion includes:
    a through port formed to pass through the back cover at a predetermined area including the area corresponding to the at least one antenna;
    a mesh body formed of a metal material and disposed in the through port; and
    a protection layer filled in the through port and configured to connect the mesh body and the back cover.

14. The back cover-integrated antenna module of claim 13, wherein the at least one antenna is attached to an inner surface of the back cover through an adhesive member having nonconductivity.

15. The back cover-integrated antenna module of claim 13, wherein the at least one antenna is any one of a WPT antenna, an MST antenna, and an NFC antenna or is a combo type including at least two antennas of a WPT antenna, an MST antenna, and an NFC antenna.

16. The back cover-integrated antenna module of claim 13, wherein a heat-radiation sheet for heat radiation is stacked on one surface of the magnetic field shielding sheet.

* * * * *